(12) United States Patent
Fujisawa et al.

(10) Patent No.: US 7,477,083 B2
(45) Date of Patent: Jan. 13, 2009

(54) DLL CIRCUIT FEEDING BACK ZQ CALIBRATION RESULT, AND SEMICONDUCTOR DEVICE INCORPORATING THE SAME

(75) Inventors: Hiroki Fujisawa, Tokyo (JP); Ryuji Takishita, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 77 days.

(21) Appl. No.: 11/585,206

(22) Filed: Oct. 24, 2006

(65) Prior Publication Data

US 2007/0132493 A1    Jun. 14, 2007

(30) Foreign Application Priority Data

Oct. 24, 2005  (JP) .............................. 2005-308072

(51) Int. Cl.
*H03L 7/00*  (2006.01)
(52) U.S. Cl. .................. 327/158; 327/147; 327/148; 327/149; 327/150; 327/156; 327/159
(58) Field of Classification Search ......... 327/147–150, 327/156–159; 365/233.1
See application file for complete search history.

(56) References Cited

U.S. PATENT DOCUMENTS 6,476,653 B1 * 11/2002 Matsuzaki ................. 327/158
6,504,408 B1    1/2003 von Kaenel
7,068,084 B2 * 6/2006 Byun et al. ................ 327/158
2004/0124896 A1 7/2004 Byun et al.

FOREIGN PATENT DOCUMENTS

| JP | 11-86545 | 3/1999 |
|---|---|---|
| JP | 2001-159999 | 6/2001 |
| JP | 2004-32070 | 1/2004 |
| JP | 2004-145709 | 5/2004 |

* cited by examiner

*Primary Examiner*—Kenneth B Wells
*Assistant Examiner*—Juan C Martinez
(74) *Attorney, Agent, or Firm*—Young & Thompson

(57) ABSTRACT

A delay amount variable circuit (8) adapted to change a delay amount according to a ZQ calibration result is inserted in a path of a DQ replica system. The delay amount of the path of the DQ replica system is variable and is adjusted so as to make constant a timing skew difference between a DQ buffer system and the DQ replica system. The ZQ calibration result changes depending on variations in temperature, voltage, and manufacture. Therefore, by obtaining the delay amount corresponding to these variations, there are obtained a DLL circuit with high accuracy that can make the skew difference constant, and a semiconductor device incorporating such a DLL circuit.

18 Claims, 4 Drawing Sheets

DLL CIRCUIT FEEDING BACK ZQ CALIBRATION RESULT, AND SEMICONDUCTOR DEVICE INCORPORATING THE SAME

This application claims priority to prior application JP 2005-308072, the disclosure of which is incorporated herein by reference.

BACKGROUND OF THE INVENTION

1. Field of the Invention

This invention relates to a semiconductor device and, in particular, relates to a DLL (Delay Locked Loop) circuit using a result of ZQ calibration adapted for adjusting the impedance of an output circuit and to a semiconductor device incorporating such a DLL circuit.

2. Description of the Related Art

Recent electronic systems have been speeded up in operation, wherein the data transfer rate between semiconductor devices forming the system has been highly increased. Further, also in each of the semiconductor devices, high-speed data transfer operation is required. Accordingly, a clock synchronization system synchronous with a clock signal (hereinafter also referred to simply as a "clock") is employed inside the semiconductor device. For example, there is a synchronous dynamic random access memory (hereinafter abbreviated as a "SDRAM") as a semiconductor memory device. Further, a DDR (Double Data Rate)-SDRAM, a DDR2-SDRAM, and a DDR3-SDRAM each synchronous with the leading and trailing edges of a clock have been developed as advanced SDRAMs.

For synchronization with an external clock, these advanced SDRAMs each employ a DLL circuit to thereby synchronize the timing between an internal clock and the external clock. FIG. 1A is a block diagram of a conventional DLL circuit. Since a DQ buffer used in the DLL circuit has a terminating element on the outside thereof, the amplitude of DQ buffer output is suppressed to a small value as shown in FIG. 1B. On the other hand, since a DQ replica has no terminating element, a DQ replica output (RCLK) exhibits its full amplitude as shown in FIG. 1C.

Inclinations and delay amounts (tPD) of these outputs change due to variations in temperature, voltage, and process, and delay times Δt1 and Δt2 of these outputs differ from each other due to a difference in amplitude therebetween. A delay line of the DLL circuit operates so as to synchronize the output of the DQ replica with an external clock CK. Therefore, as shown in FIG. 2, a difference between Δt1 and Δt2 is, as it is, observed as a skew between the output of the DQ buffer and the external clock.

In the conventional SDRAM, there is no function of measuring changes in delay amount caused by variations in temperature, voltage, and threshold voltage (Vth) of MOS transistors and feeding them back. Therefore, it is difficult to perform control that can absorb those variations. That is, there has been a problem that variations in delay amount of the DQ buffer system and delay amount of the DQ replica system caused by variations in temperature, voltage, and Vth of MOS transistors become skews as they are and thus the DLL circuit cannot achieve high-speed operation.

With respect to such a DLL circuit, there is Prior Document 1 (Japanese Unexamined Patent Application Publication (JP-A) No. Hei 11-086545). With respect to a calibration circuit for adjusting the impedance of an output circuit, there is Prior Document 2 (Japanese Unexamined Patent Application Publication (JP-A) No. 2004-032070) or Prior Document 3 (Japanese Unexamined Patent Application Publication (JP-A) No. 2004-145709). Further, with respect to a memory system, there is Prior Document 4 (Japanese Unexamined Patent Application Publication (JP-A) No. 2001-159999).

Prior Document 1 discloses a DLL circuit that detects a phase difference between an output circuit system and a dummy output circuit system to thereby eliminate a phase difference between clocks. Prior Document 2 discloses a calibration circuit that comprises fine-adjustment buffers connected in parallel, compares between a potential at a connection point and a reference potential, operates a counter in response to a comparison result, and adjusts the impedance of an output circuit according to a signal from the counter.

Prior Document 3 discloses a calibration circuit that adjusts the impedance of an output circuit according to a control signal from the exterior. Prior Document 4 discloses a memory system in which the lengths of data transmission lines are measured by monitoring reflected waves obtained when corresponding memory chips output data onto the data transmission lines, respectively, and, based on the measurement results, a system controller determines a setup time and a hold time per memory chip.

However, in the conventional DLL circuit, there is no function of measuring variations in temperature, voltage, and Vth of MOS transistors and feeding them back. Therefore, there remains the problem that variations in delay amount of the output system and delay amount of the replica system caused by variations in temperature, voltage, and Vth of MOS transistors become skews as they are and thus the high-speed operation cannot be achieved. Further, also in the conventional calibration circuits and memory system, no improvement scheme for these skews is proposed and thus there still remains the problem.

As described above, in the DLL circuit, there is no function of measuring variations in temperature, voltage, and Vth of MOS transistors and feeding them back. Therefore, there is the problem that variations in delay amount of the DQ buffer system path and delay amount of the DQ replica system path caused by variations in temperature, voltage, and Vth of MOS transistors become skews as they are and thus the high-speed operation cannot be achieved.

SUMMARY OF THE INVENTION

It is therefore an object of this invention to provide a DLL circuit that reduces a skew by feeding back a ZQ calibration result to the DLL circuit.

It is another object of this invention to provide a semiconductor device comprising such a DLL circuit.

Other objects of the present invention will become clear as the description proceeds.

A DDR3-SDRAM has a ZQ calibration function of measuring an external resistance element connected to a dedicated pad. This external resistance element is not subjected to a change caused by variations in temperature, voltage, and process. Therefore, the result of this ZQ calibration is a result reflecting variations in temperature, voltage, and process and thus can compensate for a change caused by these variations. Using this ZQ calibration result as control data, a delay amount of a replica system path of a DLL circuit is adjusted. It becomes possible to reduce a skew of the output timing by feeding back the ZQ calibration result to the DLL circuit. With this configuration, it becomes possible to provide the DLL circuit with a reduced skew and the semiconductor device having such a DLL circuit.

For accomplishing the foregoing objects, this invention basically employs techniques described below. It goes without saying that applied techniques changeable in various ways without departing from the technical principle of this invention are also included in this application.

According to an aspect of the present invention, there is provided a DLL (Delay Locked Loop) circuit comprising an output buffer path including an output buffer and a replica path including a replica output circuit, wherein the DLL circuit further comprises a delay amount variable circuit adapted to adjust a delay amount of the replica path by the use of a control signal adapted to adjust an output impedance of the output buffer.

It may be configured such that the delay amount variable circuit accepts the control signal in response to a DLL lock signal.

It may be configured such that the delay amount variable circuit comprises MOS transistors as variable capacitance elements, gates of the MOS transistors are connected to a signal line of the replica path, and substrates, sources, and drains of the MOS transistors are connected to the control signal or an inverted signal of the control signal.

It may be configured such that when the variable capacitance elements are PMOS transistors, substrates, sources, and drains of the PMOS transistors are connected to the control signal and, when the variable capacitance elements are NMOS transistors, substrates, sources, and drains of the NMOS transistors are connected to the inverted signal of the control signal.

It may be configured such that the control signal is converted into a second control signal by the use of a conversion factor and a delay amount of the delay amount variable circuit is adjusted using the second control signal.

It may be configured such that the control signal is converted into a third control signal by the use of a table lookup and a delay amount of the delay amount variable circuit is adjusted using the third control signal.

It may be configured such that the control signal is a control signal for controlling drive-side transistors of the output buffer.

It may be configured such that the control signal is a control signal for controlling load-side transistors of the output buffer.

It may be configured such that the control signal comprises a control signal for controlling load-side transistors of the output buffer and a control signal for controlling drive-side transistors of the output buffer.

According to another aspect of the present invention, there is provided a DLL (Delay Locked Loop) circuit comprising a delay line input with a clock signal; a DLL output clock driver input with a clock signal from the delay line; an output buffer input with a clock signal from the DLL output clock driver; a replica clock driver input with the clock signal from the delay line; a delay amount variable circuit input with a clock signal from the replica clock driver; an output replica buffer input with a clock signal from the delay amount variable circuit; and a phase detection circuit input with a clock signal from the output replica buffer and with the clock signal input into the delay line, thereby detecting a phase difference between the input clock signals, wherein a delay amount of the delay line is adjusted by a judgment result from the phase detection circuit and a delay amount of the delay amount variable circuit is adjusted by a control signal adapted to adjust an output impedance of the output buffer.

According to still another aspect of the present invention, there is provided a semiconductor device with a calibration function, which comprises any one of the DLL circuits as described above.

The foregoing DLL circuits each adjust a delay amount of the replica system path of the DLL circuit on the basis of a ZQ calibration result obtained by an external resistance element connected to a ZQ calibration dedicated pad. This external resistance element is not subjected to a change caused by variations in temperature, voltage, and process. Therefore, this ZQ calibration result can be used as data for compensating for variations in temperature, voltage, and process in the semiconductor device. It becomes possible to reduce a skew of the output timing by feeding back the ZQ calibration result to the DLL circuit.

That is, the following operational effects are obtained.

(1) It is possible to reduce a skew of the DQ output timing caused by a difference in circuit structure between a DQ replica and a DQ buffer.

(2) It is possible to reduce a skew of the DQ output timing caused by variations in temperature, voltage, and process.

DESCRIPTION OF THE PREFERRED EMBODIMENT

Figure 1A:
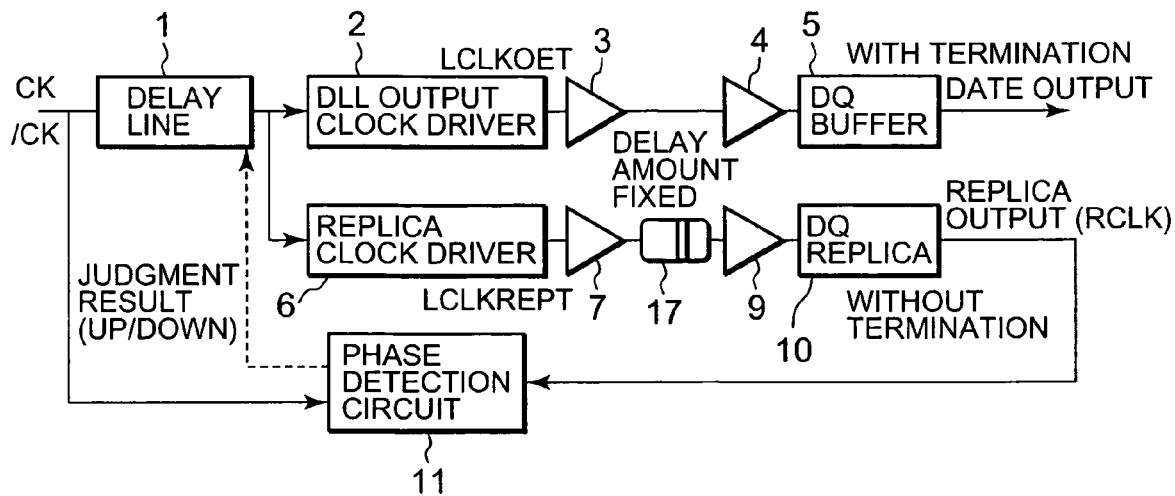
FIG. 1A is a block diagram of a conventional DLL circuit.
Figure 1B:
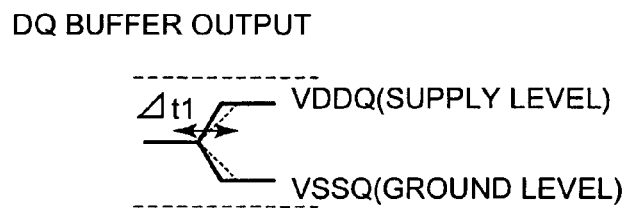
FIG. 1B is a waveform diagram showing an output of a DQ buffer included in the DLL circuit of FIG. 1A.
Figure 1C:
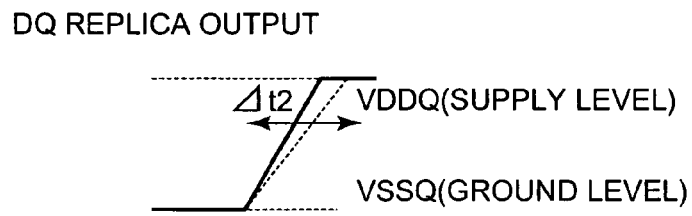
FIG. 1C is a waveform diagram showing an output (RCLK) of a DQ replica included in the DLL circuit of FIG. 1A.
Figure 2:
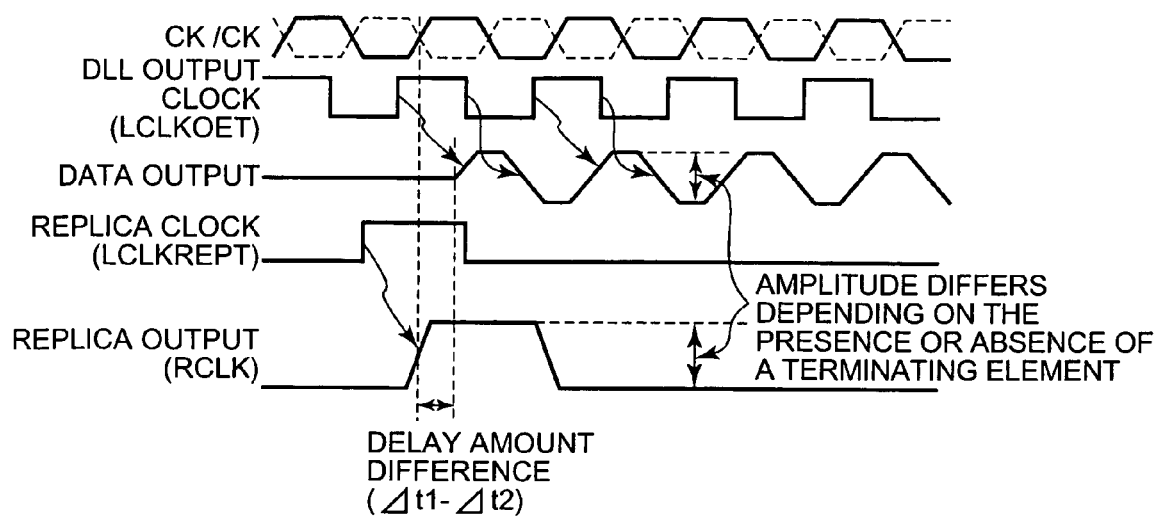
FIG. 2 is a timing diagram of the DLL circuit of FIG. 1A.
Figure 3A:
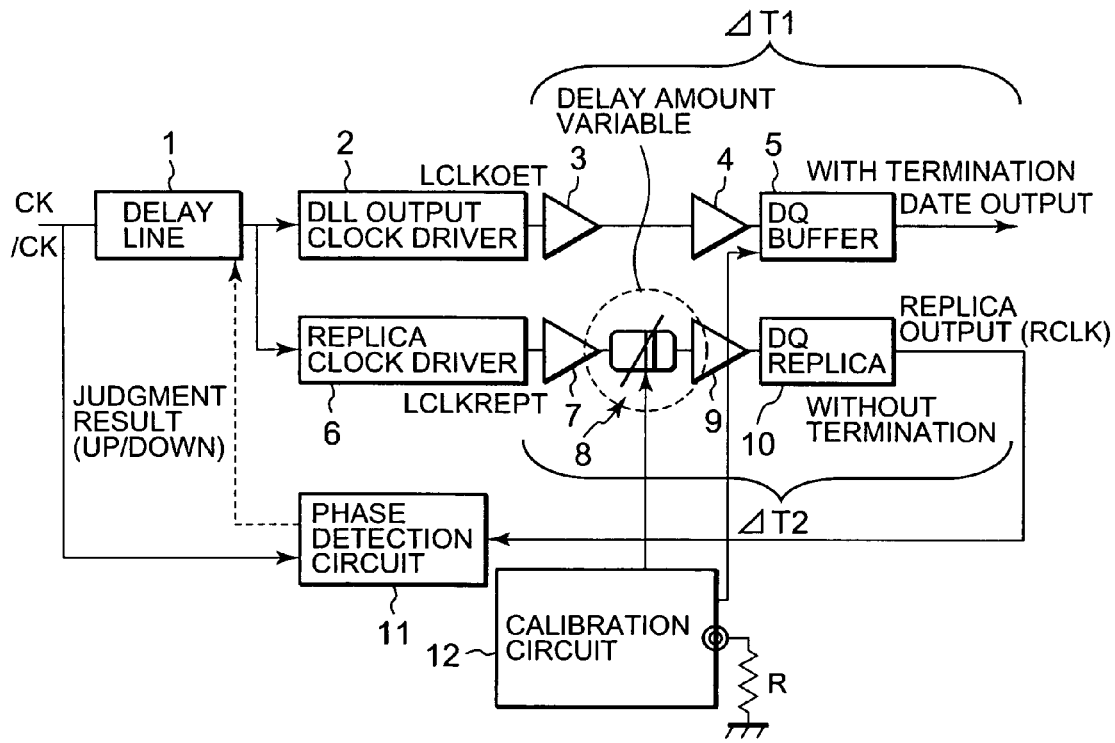
FIG. 3A is a block diagram of a DLL circuit according to an embodiment of this invention.

At first, referring to FIG. 3A, description will be made of a DLL circuit according to an embodiment of this invention.

Clocks (CK, /CK) input from the exterior are propagated to the DLL circuit through a DLL circuit-dedicated initial input stage. The properly delayed clock having passed through a delay line 1 is sent, through a DLL output clock driver 2 and buffers 3 and 4, to a DQ buffer 5 that performs memory data output. The path from the DLL output clock driver 2 to the DQ buffer 5 will be called a DQ buffer system path.

On the other hand, the clock having passed through the delay line 1 is also sent, through a replica clock driver 6, a buffer 7, a delay amount variable circuit 8, and a buffer 9, to a DQ replica 10 that simulates the same operation as that of the DQ buffer 5. The path from the replica clock driver 6 to the DQ replica 10 will be called a DQ replica system path. A phase detection circuit 11 monitors an output of the DQ replica 10 instead of an output of the DQ buffer 5, makes a phase comparison with the external clock, and feeds back a judgment result of the comparison to the delay line 1. By repeating the foregoing operation, the delay line 1 is adjusted so as to cause the output of the DQ buffer 5 to be synchronized with the external clock.

In order to allow the output of the DQ buffer 5 to be accurately synchronized with the external clock, it is desirable that a difference ($\Delta T1-\Delta T2$) between the data output timing of the DQ buffer 5 and the data output timing of the DQ replica 10 be as small as possible and, further, be constant with respect to variations in temperature, voltage, and process. However, since a terminating element, which is provided for the DQ buffer 5, is not provided for the DQ replica 10 for the purpose of a reduction in current, the amplitudes of output data differ from each other. Further, it is difficult to completely equalize the wiring length of the DQ buffer system path from the DLL output clock driver 2 to the DQ buffer 5 and the wiring length of the DQ replica system path from the replica clock driver 6 to the DQ replica 10 to each other. Therefore, generally, $\Delta T1 \ne \Delta T2$.

The delay amount variable circuit 8 adapted to compensate for this delay amount difference ($\Delta T1 - \Delta T2$) is interposed between the replica clock driver 6 and the DQ replica 10, thereby adjusting the output timing of the DQ buffer 5. The required delay amount difference ($\Delta T1 - \Delta T2$) changes due to variations in temperature, voltage, and process. Therefore, as a parameter for correcting such a change, use is made of a ZQ calibration result DRZQNT from a ZQ calibration circuit 12. By inputting the ZQ calibration result DRZQNT into the delay amount variable circuit 8 to control its delay amount, the output timing of the DQ buffer 5 is adjusted.

The ZQ calibration circuit 12 adjusts the output impedance of the DQ buffer 5 by monitoring an external resistance element R connected to a calibration dedicated pad. Since the ZQ calibration circuit is described in Prior Document 2 or the like and thus is known, detailed description thereof will be omitted. The ZQ calibration circuit 12 comprises the external resistance element R connected, for example, to a ZQ calibration terminal, a replica output circuit having a plurality of transistors, as transistors on the drive side, connected in parallel to the ZQ calibration terminal, a counter, and a comparator.

The comparator compares between a potential at the ZQ calibration terminal and a reference potential. The counter performs a count-up or count-down operation in response to an output from the comparator. The plurality of transistors of the replica output circuit are selectively turned on/off according to an output from the counter, thereby adjusting the impedance of the replica output circuit. When the impedance of the replica output circuit and the impedance of the external resistance element R become equal to each other, i.e. when the potential at the ZQ calibration terminal and the reference potential become equal to each other, the counter stops its operation to determine the ZQ calibration result DRZQNT as the counter output.

By inputting this ZQ calibration result DRZQNT, being the output from the counter, into the output circuit, the impedance of the output circuit can be adjusted so as to be equal to the resistance value of the external resistance element. By setting the resistance value of this ZQ calibration external resistance element to be equal to the impedance of a transmission line of a system, the impedance of the transmission line and the impedance of the output circuit can be matched with each other.

Assuming that the output circuit is comprised of four transistors, the ZQ calibration result DRZQNT has a four-bit configuration and is expressed as a ZQ calibration result DRZQNT <3:0>. The current driving capabilities of these four transistors are configured to have a ratio of 8:4:2:1 so as to correspond to respective bits of the binary system. In this case, by setting the ZQ calibration result DRZQNT in accordance with the binary system, it can be used as a control signal for directly controlling the transistors.

The ZQ calibration circuit is not particularly limited to the foregoing structure as long as it can be matched with the external resistance element. In the description, the drive side of the output circuit is comprised of the plurality of transistors and the impedance is controlled according to the ZQ calibration result DRZQNT <3:0>. Likewise, it may be arranged that the load side of the output circuit is comprised of a plurality of transistors and the impedance is controlled according to a ZQ calibration result DRZQPT <3:0>. Further, it may be arranged that the drive side and the load side of the output circuit are each comprised of a plurality of transistors and the impedances are controlled according to a ZQ calibration result DRZQNT <3:0> and a ZQ calibration result DRZQPT <3:0>, respectively.

Since the calibration external resistance element is externally connected, it is not affected by the state of a semiconductor chip. Therefore, the ZQ calibration result adapted for matching between the impedances of the external resistance element and the output circuit is data reflecting variations in temperature, voltage, and process of the semiconductor device and thus is a parameter adapted to compensate for these variations. Specifically, under the conditions of low temperature, low voltage, and high Vth of MOS transistors, the ZQ calibration result DRZQNT <3:0> representing the calibration result takes a high value, while, it takes a low value under the conditions of high temperature, high voltage, and low Vth of MOS transistors. That is, when the driving capability of the transistors of the output circuit is small, more transistors are selectively turned on to match the impedances. Conversely, when the driving capability of the transistors of the output circuit is large, less transistors are selectively turned on to match the impedances.

Figure 3B:
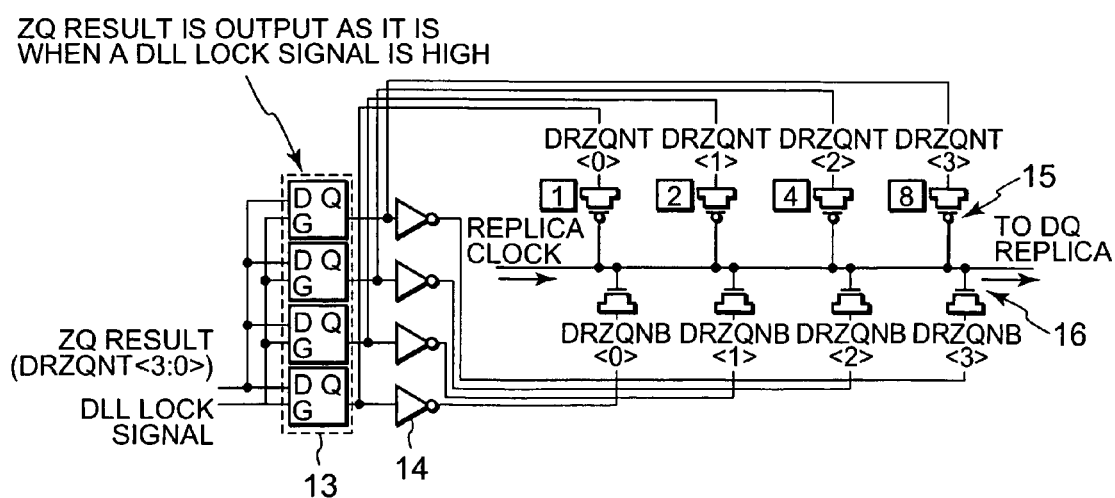
FIG. 3B is a circuit diagram of a delay amount variable circuit included in the DLL circuit of FIG. 3A.

Referring also to FIG. 3B, the delay amount variable circuit 8 will be described.

The delay amount variable circuit 8 comprises a D-FF group 13 including four D-FFs and input with a ZQ calibration result DRZQNT <3:0>, an inverter group 14 including four inverters adapted to invert corresponding constituent ZQ calibration results DRZQNT of the ZQ calibration result DRZQNT <3:0>, respectively, and capacitive delay element groups 15 and 16 connected to a signal line and each including four capacitive delay elements. Each capacitive delay element is in the form of a transistor having a gate electrode connected to the signal line. The capacitive delay elements of the capacitive delay element group 15 disposed on the upper side in FIG. 3B are p-channel MOS capacitive elements, while, the capacitive delay elements of the capacitive delay element group 16 disposed on the lower side are n-channel MOS capacitive elements. Herein, capacitance values of the transistors are set to a ratio of 8:4:2:1 from the right corresponding to the binary system. By setting the capacitance values corresponding to the binary system, it is possible to carry out a control with the binary-system ZQ calibration result DRZQNT <3:0>.

The ZQ calibration result DRZQNT <3:0> is connected to substrates, sources, and drains of the p-channel MOS capacitive elements, while, an inverted ZQ calibration result DRZQNB <3:0> of the ZQ calibration result DRZQNT <3:0> is connected to substrates, sources, and drains of the n-channel MOS capacitive elements. The ZQ calibration result DRZQNT <3:0> and the inverted ZQ calibration result DRZQNB <3:0> are input to thereby control the potential applied to the capacitive delay elements.

For example, when the ZQ calibration result DRZQNT is <0100>, the capacitive delay element disposed at the second from the right on the upper side in FIG. 3B is connected to a supply potential, while, the capacitive delay element disposed at the second from the right on the lower side is connected to a ground potential, thereby changing capacitance values thereof. The remaining capacitive delay elements on the upper side are connected to the ground potential, while, the remaining capacitive delay elements on the lower side are connected to the supply potential. The capacitive delay element input with the constituent ZQ calibration result DRZQNT having a high level reduces its capacitance value because the transistor is inverted. Conversely, the capacitive delay element input with the constituent ZQ calibration result DRZQNT having a low level serves as a storage region and thus its capacitance value is large. In this manner, the capacitance value changes depending on the high or low level of the corresponding constituent ZQ calibration result.

When the driving capability of the transistors of the output circuit is reduced due to low temperature, low voltage, and process variation, the ZQ calibration result DRZQNT takes a large value. As a result, the capacitance of the capacitive delay elements exhibits, oppositely, a small value. However, with the driving using the transistors with the small driving capability due to process variation, its delay amount increases equivalently to a delay amount of the DQ buffer system path. Therefore, the delay amount difference ($\Delta T1 - \Delta T2$) between the DQ buffer system path and the DQ replica system path becomes constant. In this manner, by switching the potential at the substrate, source, and drain of each transistor (capacitive delay element) between the supply potential and the ground potential, its capacitance value is changed. By changing the capacitance values connected to the signal line, the delay amount difference between signals is controlled so as to be small and constant.

As described above, the ZQ calibration result DRZQNT <3:0> is used as a switching signal for the delay elements so that the delay amount difference ($\Delta T1 - \Delta T2$) becomes constant within the variation ranges of temperature, voltage, and so on.

The D-FFs accept the corresponding constituent ZQ calibration results DRZQNT of the ZQ calibration result DRZQNT <3:0> in synchronism with a DLL lock signal, respectively. Therefore, an actual change in delay amount of the delay amount variable circuit occurs in the DLL circuit when checking the DLL lock. By allowing the last ZQ calibration result to be input when checking the DLL lock, it is prevented that the delay amount changes during operation of the DLL circuit. During the DLL lock time where initialization of the DLL circuit is carried out, the delay amount of the delay line largely changes and, further, the ZQ calibration is carried out and thus the calibration result is not finalized. Therefore, a latch circuit is inserted so as to apply the ZQ calibration result after the DLL lock is finished.

Figure 4:
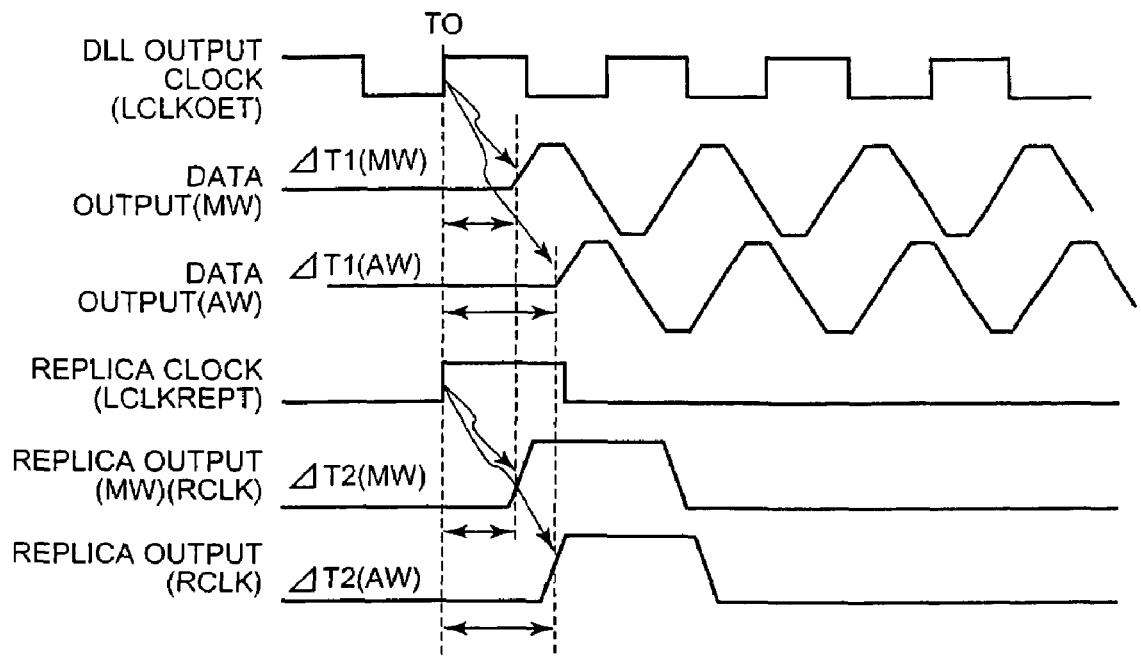
FIG. 4 is a timing diagram of the DLL circuit of FIG. 3A.

Now, the detailed operation of DLL clock adjustment in the DLL circuit will be described with reference to a timing diagram of FIG. 4.

In response to a clock LCLKOET output from the DLL output clock driver 2 at time instant T0, the DQ buffer 5 outputs data after $\Delta T1$. On the other hand, in response to a clock LCLKREPT output from the replica clock driver 6, the DQ replica 10 outputs data after $\Delta T2$. $\Delta T1$ and $\Delta T2$ change due to variations in temperature, voltage, and process. The fastest delay amount of $\Delta T1$ is given as $\Delta T1$ (MW) and the slowest delay amount of $\Delta T1$ is given as $\Delta T1$ (AW). Likewise, the fastest delay amount of $\Delta T2$ is given as $\Delta T2$ (MW) and the slowest delay amount of $\Delta T2$ is given as $\Delta T2$ (AW).

Generally, a $\Delta T1$ change amount ($\Delta T1$ (AW)$-\Delta T1$ (MW)) and a $\Delta T2$ change amount ($\Delta T2$ (AW)$-\Delta T2$ (MW)) differ from each other. Therefore, an offset is generated between the data output timing of the DQ buffer 5 and the data output timing of the DQ replica 10 due to variations in temperature, voltage, and process. Since the delay line in the DLL circuit monitors the output of the DQ replica and synchronizes it with the external clock, the generated offset is added as a skew between the external clock and the DQ output.

Therefore, the delay amount variable circuit 8 is inserted in the path of the clock LCLKREPT so that the timing difference between the DQ buffer output and the DQ replica output becomes constant regardless of variations in temperature, voltage, and process. When the delay of LCLKREPT relative to LCLKOET increases due to variations in temperature, voltage, and process, the delay amount of the delay amount variable circuit 8 is controlled to be reduced, while, when the delay of LCLKREPT relative to LCLKOET decreases, the delay amount of the delay amount variable circuit 8 is controlled to be increased.

Figure 5:
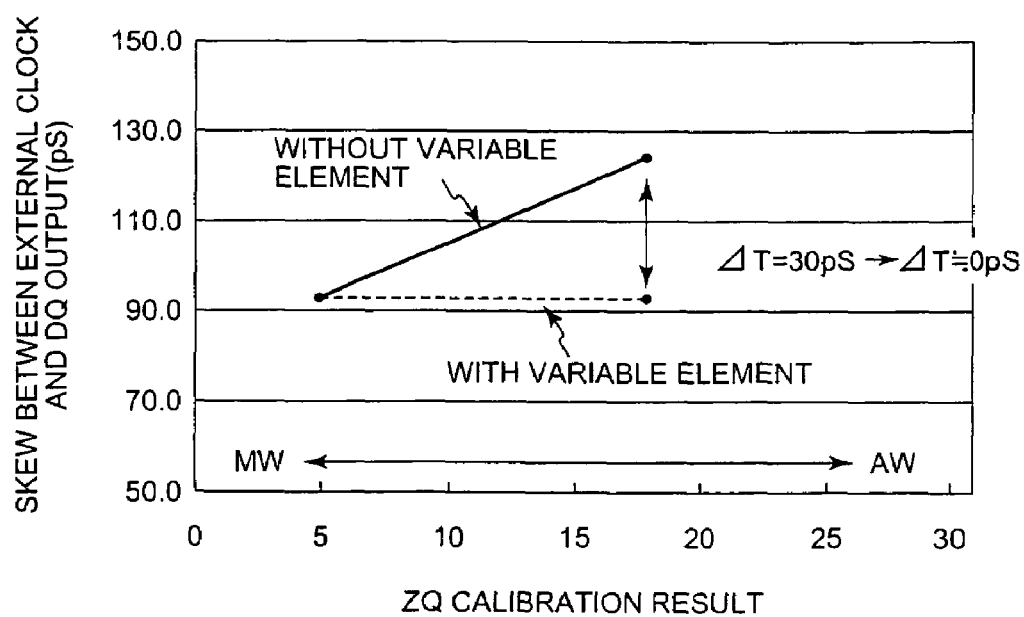
FIG. 5 is a diagram showing a skew comparison result for explaining an effect of this invention.

FIG. 5 shows skews between the external clock and the DQ output when the delay amount variable circuit using the ZQ calibration result is inserted in the path of LCLKREPT and when it is not inserted in the path of LCLKREPT. As seen from FIG. 5, the variation between the parameters can be made substantially zero by the use of the delay amount variable circuit. Since the ZQ calibration result takes a high value when the temperature is low, the voltage is low, and the Vth is high, and a low value when the temperature is high, the voltage is high, and the Vth is low, it can be regarded as a parameter representing variations in temperature, voltage, and process.

In the foregoing embodiment, the delay adjustment is carried out using only the n-channel MOS measurement result (DRZQNT <3:0>) of the ZQ calibration on the drive side of the output circuit. However, the delay adjustment may be carried out using only the p-channel MOS measurement result (DRZQPT <3:0>) of the ZQ calibration on the load side of the output circuit. Further, the delay adjustment may be carried out using both ZQ measurement results in consideration of unbalance between NMOS Vth and PMOS Vth. Also in this case, an inverted control signal may be used as a control signal for the n-channel MOS capacitive elements. With this configuration, it is also possible to reduce a skew of the DQ output timing caused by variation in Vth between n-channel MOS transistors and p-channel MOS transistors.

It is to be noted that, in the DLL (Delay Locked Loop) circuit adapted to control the data output timing of the memory, the function is added which improves the accuracy of adjustment of the data output timing by applying the result (ZQ calibration result) obtained by monitoring the terminating resistance value of the chip.

In a conventional DLL circuit, a clock (LCLKOET) output from a DLL output clock driver is sent to a DQ buffer and a delay adjusting portion (delay line) is adjusted so as to synchronize the data output timing with an external clock. This adjustment of the delay line is carried out by monitoring, in a phase detection circuit, an output of a DQ replica that simulates the same operation as that of the DQ buffer, making a phase comparison with the external clock, and feeding back a judgment result of the comparison to the delay line.

Accordingly, the adjustment is carried out in such a manner as to monitor the output of the DQ replica instead of monitoring the output of the DQ buffer and synchronize it with the external clock. Therefore, it is ideal that a delay time or amount ($\Delta T1$) in signal propagation from the DLL output clock driver to the DQ buffer output and a delay time or amount ($\Delta T2$) in signal propagation from a replica clock driver to the DQ replica output become equal to each other ($\Delta T1 = \Delta T2$). However, a difference occurs between these delay amounts for the reasons that the complete equal-length wiring is difficult in terms of layout, a terminating element is not provided for the DQ replica for the purpose of a reduction in current, and so on.

In the above-mentioned DLL circuit, the delay amount variable circuit is inserted in the path of the output of the replica clock driver in the conventional DLL circuit for absorbing the difference in delay amount between the DQ buffer system path and the DQ replica system path. Since the required delay amount changes due to variations in temperature, voltage, and process, the ZQ calibration result obtained by monitoring the external terminating resistance is used as a parameter for estimating such a change. With this configuration, it becomes possible to reduce the error in delay amount caused by variations in temperature, voltage, and process and by the difference in circuit structure between the DQ replica and the DQ buffer and thus the effect is obtained that the accuracy of timing adjustment of the DLL circuit can be improved. There are obtained the DLL circuit that can improve the timing adjustment accuracy, and the high-speed operable semiconductor device having such a DLL circuit.

While the present invention has thus far been described in connection with a single embodiment thereof, it will readily be possible for those skilled in the art to put this invention into practice in various other manners. In the above-mentioned embodiment, the description has been made of the case where the ZQ calibration result DRZQNT <3:0> is directly used as the control signal. However, the ZQ calibration result DRZQNT <3:0> is the impedance control signal of the output circuit and, therefore, there may be a case where it is not put in perfect 1:1 correspondence with a capacitance control signal. Accordingly, for more accurate control, it may be arranged that the ZQ calibration result DRZQNT <3:0> is subjected to conversion with a conversion factor and then is used as a capacitance control signal. Further, it may be arranged that the ZQ calibration result DRZQNT <3:0> is subjected to conversion using a table lookup and then is used as a capacitance control signal.

What is claimed is:

1. A DLL (Delay Locked Loop) circuit comprising:
    an output buffer path including an output buffer;
    a replica path including a replica output circuit; and
    a delay amount variable circuit adapted to adjust a delay amount of said replica path by the use of a control signal adapted to adjust an output impedance of said output buffer,
    wherein said delay amount variable circuit comprises MOS transistors as variable capacitance elements, gates of said MOS transistors are connected to a signal line of said replica path, and substrates, sources, and drains of said MOS transistors are connected to said control signal or an inverted signal of said control signal.

2. The DLL circuit according to claim 1 wherein said delay amount variable circuit accepts said control signal in response to a DLL lock signal.

3. The DLL circuit according to claim 1, wherein when said variable capacitance elements are PMOS transistors, substrates, sources, and drains of said PMOS transistors are connected to said control signal and when said variable capacitance elements are NMOS transistors, substrates, sources, and drains of said NMOS transistors are connected to said inverted signal of said control signal.

4. The DLL circuit according to claim 1, wherein said control signal is converted into a second control signal by the use of a conversion factor and a delay amount of said delay amount variable circuit is adjusted using said second control signal.

5. A DLL (Delay Locked Loop) circuit comprising:
    an output buffer path including an output buffer;
    a replica path including a replica output; and
    a delay amount variable circuit adapted to adjust a delay amount of said replica path by the use of a control signal adapted to adjust an output impedance of said output buffer,
    wherein said control signal is converted into a third control signal by the use of a table lookup and a delay amount of said delay amount variable circuit is adjusted using said third control signal.

6. The DLL circuit according to claim 1, wherein said control signal for controlling drive-side transistors of said output buffer.

7. The DLL circuit according to claim 1, wherein said control signal is a control signal for controlling load-side transistors of said output buffer.

8. The DLL circuit according to claim 1, wherein said control signal comprises a control signal for controlling load-side transistors of said output buffer and a control signal for controlling drive-side transistors of said output buffer.

9. A DLL (Delay Locked Loop) circuit comprising:
    a delay line input with a clock signal;
    a DLL output clock driver input with a clock signal from said delay line;
    an output buffer input with a clock signal from said DLL output clock driver;
    a replica clock driver input with the clock signal from said delay line;
    a delay amount variable circuit input with a clock signal from said replica clock driver;
    an output replica buffer input with a clock signal from said delay amount variable circuit; and
    a phase detection circuit input with a clock signal from said output replica buffer and with the clock signal input into said delay line, thereby detecting a phase difference between said input clock signals,
    wherein a delay amount of said delay line is adjusted by a judgment result from said phase detection circuit and a delay amount of said delay amount variable circuit is adjusted by a control signal adapted to adjust an output impedance of said output buffer.

10. A semiconductor device with a calibration function, wherein said semiconductor device comprises the DLL circuit according to claim 1.

11. A semiconductor device with a calibration function, wherein said semiconductor device comprises the DLL circuit according to claim 2.

12. A semiconductor device with a calibration function, wherein said semiconductor device comprises the DLL circuit according to claim 3.

13. A semiconductor device with a calibration function, wherein said semiconductor device comprises the DLL circuit according to claim 4.

14. A semiconductor device with a calibration function, wherein said semiconductor device comprises the DLL circuit according to claim 5.

15. A semiconductor device with a calibration function, wherein said semiconductor device comprises the DLL circuit according to claim 6.

16. A semiconductor device with a calibration function, wherein said semiconductor device comprises the DLL circuit according to claim 7.

17. A semiconductor device with a calibration function, wherein said semiconductor device comprises the DLL circuit according to claim 8.

18. A semiconductor device with a calibration function, wherein said semiconductor device comprises the DLL circuit according to claim 9.

* * * * *